(12) United States Patent
Miyazaki

(10) Patent No.: US 7,294,929 B2
(45) Date of Patent: Nov. 13, 2007

(54) SOLDER BALL PAD STRUCTURE

(75) Inventor: Hiroshi Miyazaki, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/750,059

(22) Filed: Dec. 30, 2003

(65) Prior Publication Data
US 2005/0146030 A1 Jul. 7, 2005

(51) Int. Cl.
*H01L 29/40* (2006.01)
(52) U.S. Cl. .................. 257/737; 257/734; 257/779; 257/E21.508; 257/E23.021
(58) Field of Classification Search ........ 257/737–738, 257/779–781, 784, 786, 792, 668, E21–503, 257/E23.119, 21.508, 23.021
See application file for complete search history.

(56) References Cited

U.S. PATENT DOCUMENTS

| | | | |
|---|---|---|---|
| 5,148,266 A | 9/1992 | Khandros et al. ............. 357/80 |
| 5,187,020 A * | 2/1993 | Kwon et al. ................. 428/601 |
| 5,508,228 A * | 4/1996 | Nolan et al. ................. 438/614 |
| 5,666,270 A * | 9/1997 | Matsuda et al. ............. 361/704 |
| 5,796,163 A | 8/1998 | Glenn et al. |
| 5,866,952 A * | 2/1999 | Wojnarowski et al. ...... 257/788 |
| 5,874,782 A * | 2/1999 | Palagonia .................... 257/778 |
| 6,107,180 A * | 8/2000 | Munroe et al. .............. 438/613 |
| 6,147,401 A * | 11/2000 | Solberg ........................ 257/723 |
| 6,201,305 B1 | 3/2001 | Darveaux et al. |
| 6,211,572 B1 * | 4/2001 | Fjelstad et al. .............. 257/781 |
| 6,265,300 B1 * | 7/2001 | Bhansali et al. ............. 438/612 |
| 6,277,669 B1 * | 8/2001 | Kung et al. .................. 438/106 |
| 6,376,353 B1 * | 4/2002 | Zhou et al. ................... 438/612 |
| 6,423,576 B1 * | 7/2002 | Hoffman ...................... 438/118 |
| 6,433,427 B1 * | 8/2002 | Wu et al. ..................... 257/737 |
| 6,465,878 B2 * | 10/2002 | Fjelstad et al. .............. 257/668 |
| 6,486,003 B1 * | 11/2002 | Fjelstad ....................... 438/117 |
| 6,552,563 B1 * | 4/2003 | Yaniv et al. ................. 324/770 |
| 6,586,676 B2 | 7/2003 | Pritchett et al. |
| 6,624,504 B1 | 9/2003 | Inoue et al. |
| 6,720,212 B2 * | 4/2004 | Robl et al. ................... 438/132 |
| 6,767,819 B2 * | 7/2004 | Lutz ............................. 438/614 |
| 6,770,547 B1 * | 8/2004 | Inoue et al. ................. 438/496 |
| 6,806,570 B1 * | 10/2004 | Lee et al. ..................... 257/737 |
| 6,816,385 B1 * | 11/2004 | Alcoe ........................... 361/767 |
| 6,836,018 B2 * | 12/2004 | Kim et al. .................... 257/773 |
| 6,847,107 B2 * | 1/2005 | Fjelstad et al. .............. 257/690 |
| 6,914,333 B2 * | 7/2005 | Lo et al. ....................... 257/737 |
| 6,919,264 B2 * | 7/2005 | Brintzinger et al. ........ 438/614 |
| 2003/0047339 A1 * | 3/2003 | Lutz ............................. 174/52.1 |
| 2004/0087131 A1 * | 5/2004 | Britzinger et al. .......... 438/614 |

\* cited by examiner

*Primary Examiner*—Thao X. Le
(74) *Attorney, Agent, or Firm*—Yingsheng Tung; Wade James Brady, III; Frederick J. Telecky, Jr.

(57) ABSTRACT

An interconnect structure a substrate, a contact pad disposed over a surface of the substrate, and an insulative mask disposed over the contact pad. The insulative mask can include an opening that is aligned over and exposes an inner portion of the contact pad. The inner portion of the contact pad includes a compliant layer and a conductive layer that is disposed over the compliant layer. The inner portion of the contact pad has sufficient flexibility to distribute mechanical stress applied to the contact pad and can mitigate damage to the interconnect structure.

14 Claims, 5 Drawing Sheets

_US 7,294,929 B2_

SOLDER BALL PAD STRUCTURE

TECHNICAL FIELD

The present invention relates to the mounting and connecting of electronic devices, and, more particularly, to an interconnect structure for mounting solder balls.

BACKGROUND OF THE INVENTION

An increasing demand for electronic equipment that is smaller, lighter, and more compact has resulted in a concomitant demand for semiconductor packages that have smaller outlines and mounting "footprints." One response to this demand has been the development of the "flip-chip" method of attachment and connection of semiconductor chips to substrates. Sometimes referred to as the "Controlled Collapse Chip Connection," or "C4," method, the technique involves forming balls of a conductive metal (e.g., solder or gold) on input/output connection pads on the active surface of the chip, then inverting, or "flipping" the chip upside-down, and "reflowing" the conductive balls (i.e., heating them to the melting point) to fuse them to corresponding connection pads on a substrate.

Another response has been the development of ball grid array (BGA) semiconductor packages that "surface mount" and electrically connect to an associated substrate (e.g., a printed circuit board (PCB)), with a plurality of solder balls in a method, sometimes referred to as the "C5" method, that is analogous to the flip-chip method described above for mounting and connecting dies.

In both the C4 die and C5 package mounting and connection methods, a plurality of solder balls are attached to respective solder ball mounting lands, or pads, defined on a surface of the die or package. The solder ball mounting pad can, but need not be, defined by an opening in an insulative layer or mask called a "passivation layer" in the case of a semiconductor die, or a "solder mask" in the case of a BGA package, as described below.

FIG. 1 illustrates a schematic cross-sectional view of a substrate 10 having a solder-mask-defined ("SMD") solder ball mounting pad 12 formed thereon in accordance with the prior art. The substrate 10 can comprise a sheet 14 of an insulative material, such as fiberglass, polyimide tape, or ceramic. Alternatively, it may comprise a semiconductor chip or die.

The mounting pad 12 typically comprises a layer of metal (e.g., copper, aluminum, gold, silver, nickel, tin, platinum, or a combination of the foregoing) that has been laminated and/or plated on a surface of the sheet 14, and then patterned using known photolithography techniques into a contact pad structure 16, which may include one or more circuit traces (not shown) radiating outward from it.

An insulative mask 20, referred to as a passivation layer in the case of a semiconductor die, or a solder mask in the case of a BGA package, is formed over the metal layer, including the contact pad 16. The insulative mask 20 may comprise an acrylic or a polyimide plastic, or alternatively an epoxy resin, that is silk screened or photo-deposited on the sheet 14. An opening 22 is formed in the insulative mask 20 to expose a central portion 28 of the contact pad 16, and a solder ball 30 is attached to the central portion 28 of the contact pad 16 thus exposed. Since the mask 20 prevents the solder of the solder ball 30 from attaching to any portion of the pad 16 other than the central portion 28 that is exposed through the opening 22, the pad 16 is referred to a solder-mask-defined or SMD-type of solder ball mounting pad, as above.

The SMD pad shown in FIG. 1 provides good "end-of-line" (i.e., at the end of the semiconductor package fabrication line) ball 30 shear resistance because the insulative mask 20 overlaps the entire peripheral edge of the pad 16, and hence, resists ripping of the pad from the sheet 14 when mechanical forces act on the solder ball 30 attached thereto. The SMD pad also affords relatively stable control of the "x-y" positional tolerances of the solder ball 30 (i.e., control of the lateral position of the solder ball 30 on the surface of the sheet 14).

SUMMARY OF THE INVENTION

The present invention relates to an interconnect structure for receiving a solder contact. The interconnect structure includes a substrate, a contact pad disposed over a surface of the substrate, and an insulative mask disposed over the contact pad. The insulative mask can include an opening that is aligned over and that exposes an inner portion of the contact pad. The inner portion of the contact pad includes a compliant layer and a conductive layer that is disposed over the compliant layer. The compliant layer can be formed from a compliant material that has an elastic modulus lower than the material used to form the conductive layer. Alternatively, the compliant material can have an elastic modulus higher the elastic modulus of the material used to form the conductive layer, as long as the compliant layer is more flexible than the conductive layer. The inner portion of the contact pad has sufficient flexibility to distribute mechanical stress applied to the contact pad and can mitigate damage to the interconnect structure.

In another aspect of the invention, the opening can expose a substantially planar contact surface with at least one protrusion that extends within the opening from the contact surface. The protrusion can be defined by a surface of the conductive layer of the inner portion. The protrusion can substantially improve shear performance and attach yield of the solder contact to the contact pad.

The present invention also relates to a method of fabricating an interconnect structure for a solder contact. In the method, a contact pad can be formed over a substrate. The contact pad can include an inner portion that comprises a compliant layer and a conductive layer that is disposed over the compliant layer. An insulative mask can be formed over the contact pad. The insulative mask can include an opening aligned over the inner portion of the contact pad that exposes a surface of the conductive layer. The inner portion of the contact pad has sufficient flexibility to distribute mechanical stress applied to the contact pad and mitigate damage to the interconnect structure.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to an interconnect structure for receiving a solder contact (e.g., solder ball). The interconnect structure provides an improved solder shear performance and solder attach yield with the solder contact. The interconnect structure includes a contact pad that is disposed over a substrate. The contact pad provides an electrically conductive interface for attachment of the solder contact. The contact pad comprises an outer portion and a flexible inner portion. The flexible inner portion includes compliant layer and a conductive layer, which can reside over the compliant layer. The compliant layer can be formed from a compliant material that has an elastic modulus lower than the material used to form the conductive layer. Alternatively, the compliant material can have an elastic modulus higher the elastic modulus of the material used to form the conductive layer, as long as the compliant layer is more flexible than the conductive layer.

The inner portion provides the contact pad with sufficient flexibility to allow the contact pad to bend when mechanical force is applied to the contact pad. By allowing the contact pad to bend upon application of mechanical force, mechanical stress at the interface between the solder contact is mitigated and the connection between the contact pad and the solder contact is improved. Moreover, the interconnect structure can provide an improved shear performance and attach yield with the solder contact.

Figure 1:
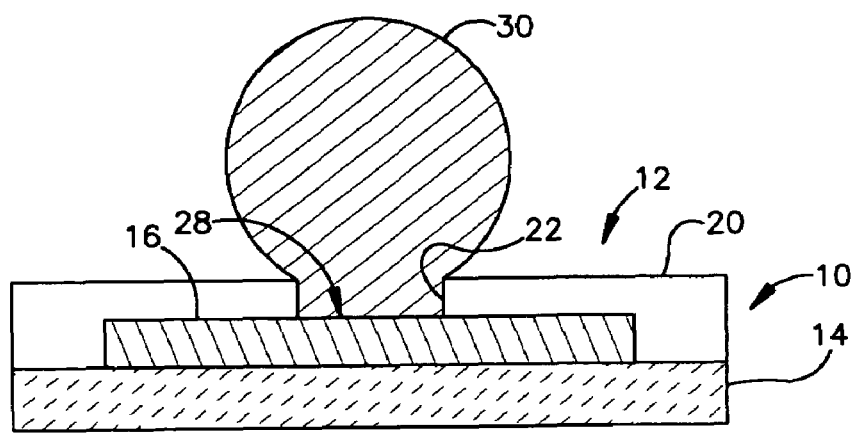
FIG. 1 illustrates a schematic cross-sectional view of a portion of a solder ball pad structure in accordance with the prior art.
Figure 2:
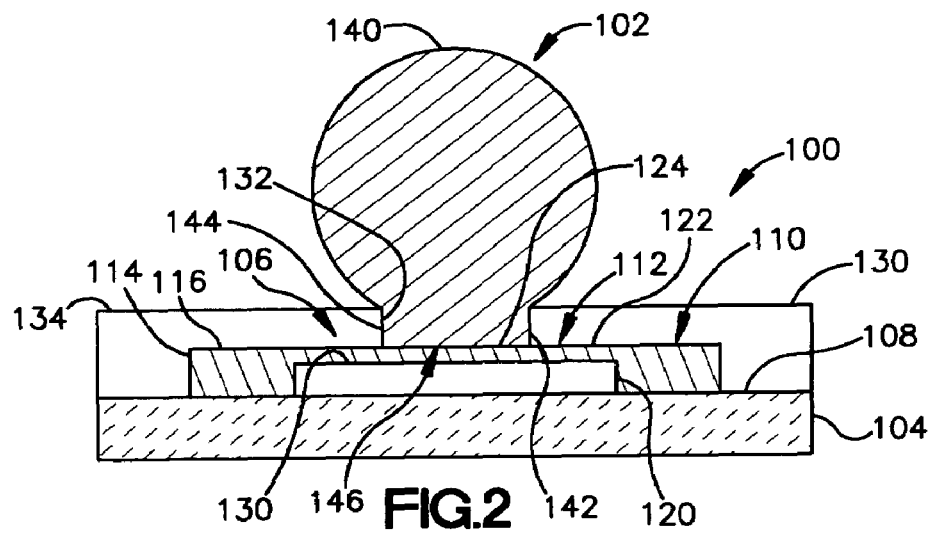
FIG. 2 illustrates a schematic cross-sectional view of a portion of an interconnect structure and a solder contact in accordance with a first aspect of the present invention.

FIG. 2 illustrates a schematic cross-sectional view of an exemplary interconnect structure 100 and a solder contact 102 (e.g., solder ball) attached to the interconnect structure 100. The interconnect structure 100 includes a substrate 104 and a contact pad 106 disposed over a surface 108 of the substrate 104. The substrate 104 can comprise a substantially planar sheet of insulative material, such as fiberglass (e.g., flame retardant fiberglass composite substrate board), polyimide tape (e.g., bismaleimide-triazine resin (BT-resin)), or ceramic. Alternatively, the substrate 104 can comprise a layer on a semiconductor die, such as silicon oxide (SiO), silicon nitride ($Si_3N_4$), polyimide, silicon dioxide ($SiO_2$), or some other insulative material formed on a die. It will be appreciated that other materials can be used to form the substrate 104.

The contact pad 106 includes an outer portion 110 and an inner portion 112 that is substantially more flexible than the outer portion 110. The outer portion 110 comprises at least one conductive layer 114 that surrounds the inner portion 112 of the contact pad 106. The at least one conductive layer 114 has a substantially planar top surface 116 that forms the top surface of the outer portion 110. The thickness of the at least one conductive layer 114 that forms the outer portion 110 is such that the outer portion 110 can be substantially rigid. The at least one conductive layer can comprise at least one conductive metal (e.g., copper, aluminum, gold, silver, nickel, tin, platinum, or a combination of the foregoing) that has been formed (e.g., by lamination or plating) on the surface 108 of the substrate 104 and then etched (e.g., reactive ion etching (RIE)).

The inner portion 112 of the contact pad 106 has sufficient flexibility to distribute mechanical stress applied to the contact pad 106 and to mitigate damage to the interconnect structure 100. The inner portion 112 of the contact pad 106 includes a compliant layer 120 and an inner conductive layer 122 that is disposed over the compliant layer 120. The inner conductive layer 122 has a substantially planar surface 124 that defines a contact surface 124 of the contact pad 106. The inner conductive layer 122 has a thickness substantially less than the thickness of the at least one conductive layer 114 of the outer portion 110 of the contact pad 106. The reduced thickness of the inner conductive layer 122 compared to the thickness of the at least one conductive layer 114 allows the inner conductive layer 122 to be substantially less rigid (i.e., substantially more flexible) than the at least one conductive layer 114 of the outer portion 110. The inner conductive layer 122 can comprise the same conductive metal (e.g., copper, aluminum, gold, silver, nickel, tin, platinum, or combination of the foregoing) as the conductive layer 114 of the outer portion 110 and can be formed on a surface 130 of the compliant layer 120 (and the surface 116 of the at least one conductive layer 114) by, for example, lamination or plating.

The compliant layer 120 comprises a compliant material that readily flexes to relieve (or distribute) mechanical stress applied to the contact pad 106. In one aspect of the invention, the compliant layer can be sufficiently flexible to distribute mechanical stress applied to the contact pad 106 and mitigate damage to the interconnect structure 100. In another aspect of the invention, the compliant layer 120 can be more flexible than inner conductive layer 122. The compliant material can comprise a metal, a non-metal material, a ceramic, or a composite of the foregoing that can be deposited (e.g., plating, chemical vapor deposition (CVD), or spin-on) on the surface 108 of the substrate 104. The compliant material can have an elastic modulus lower than the material used to form the inner conductive layer 122. For example, where the inner conductive layer 122 comprises copper (modulus of elasticity about 17 $lbs/in^2 \times 10^6$), the compliant layer 120 can be formed from lead (modulus of elasticity about 2 $lbs/in^2 \times 10^6$). It will be appreciated, though, that the compliant material can have an elastic modulus higher than the elastic modulus of the material used to form the inner conductive layer 122, as long as the compliant layer 120 readily flexes. For example, the inner conductive layer 122 can comprise copper (modulus of elasticity about 17 $lbs/in^2 \times 10^6$) and the compliant layer can comprise platinum (modulus of elasticity about 21 $lbs/in^2 \times 10^6$). The platinum compliant layer 120, however, can include pores, apertures, or voids that allow the compliant layer 120 to more readily flex.

The contact pad 106, in addition to including the inner portion 112 and the outer portion 110, can include one or more circuit traces (not shown) radiating outward from the contact pad 106. Alternatively, or in addition to the circuit traces, a via (not shown) can electrically connect the contact pad 106 with an opposite surface of the substrate 104.

An insulative mask 130 is disposed over the surface 108 of the substrate 104 and the outer portion 110 of the contact pad 106. The insulative mask 130 can electrically isolate the contact pad 106 from the conductive traces (not shown). The insulative mask 130 can define an opening 132 that is aligned over the inner portion 112 of the contact pad 106. The opening 132 can be substantially cylindrical and extend from a surface 134 of the insulative mask 130 to the substantially planar contact surface 124 of the inner portion 112 of the contact pad 106. The insulative mask 130 can comprise, for example, an acrylic or polyimide plastic or epoxy resin, that can be deposited on the contact pad 106 and the substrate 104, patterned (e.g., photolithography), and developed.

The solder contact 102 includes a ball portion 140 and a contact portion 142. The ball portion 140 is seated over the opening 132 of the insulative mask 130. Although the ball portion 140 of the solder contact 102 is illustrated as being substantially spherical, the ball portion 140 may have various forms, such as semispherical, half-dome, or truncated cone. The exact shape of the ball portion 140 is a function of the deposition technique (e.g., evaporation, plating, or pre-fabricated units) and reflow technique (e.g., infrared or radiant technique), and the material composition. The contact portion 142 of the solder contact 102 extends from the ball portion 140 and forms a solder joint 146 with the contact surface 124. The insulative mask 130 defines an outer surface 144 of the contact portion 142 and prevents the contact portion 142 from contacting the conductive traces (not shown). The material used to form the solder contact 102 can include alloys of lead, tin, indium, silver, and combinations of the foregoing. It will be appreciated that other materials can also be used in forming the solder contact 140, such as solder paste, flux, and conductive adhesive compounds.

The solder joint 146 formed between the solder contact 102 and the contact pad 106 is resistant to fracture or shearing from mechanical stress (or mechanical force) applied to the solder contact 102 or the interconnect structure 100. For example, impact of the interconnect structure 100 or solder contact 102 with an object or structure (e.g. floor) can cause mechanical stress to accumulate at the solder joint 146. The flexible compliant layer 120 and inner conductive layer 122 allow the inner portion 112 of the contact pad 106 to flex and distribute at least some of the mechanical stress and mitigate damage to the solder joint 146. It will be appreciated that the contact pad 106 of the present invention can distribute mechanical stress applied to the interconnect structure 100 and solder contact 102 from other sources, such as mechanical stress induced during post fabrication processing as well as mechanical stress resulting from shipping and normal customer use of the interconnect structure 100.

Figure 3:
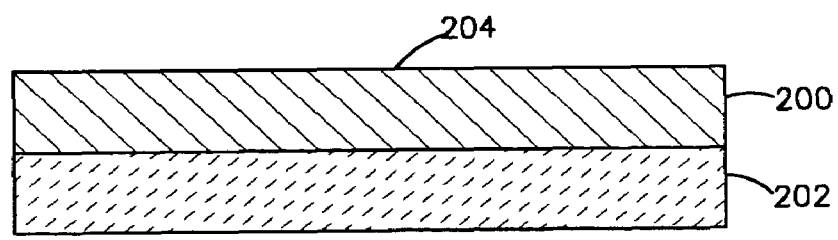
FIG. 3 illustrates a schematic cross-sectional view of a conductive layer disposed over a substrate in accordance with an aspect of the present invention.

FIGS. 3-12 illustrate a methodology of fabricating a portion of the interconnect structure. Referring to FIG. 3, a conductive layer 200 is formed over a substrate 202. The substrate 202 can comprise a sheet of an insulative material, such as fiberglass, polyimide tape, or ceramic. Alternatively, the substrate 202 can comprise a layer on a semiconductor die, such as silicon oxide, silicon nitride, polyimide, silicon dioxide, or another insulative material formed on the die.

The conductive layer 200 can include any conductive metal that can be used to form a contact pad for a semiconductor device. In one example, the conductive metal can comprise copper. Other examples of conductive metals that can be used to form the conductive layer include copper alloy, aluminum, aluminum alloy, tungsten, tungsten alloy, gold, silver, nickel, tin, platinum, iridium, or combinations of the foregoing. It will be appreciated that other metals or non-metals can be used. By way of example, the conductive layer 200 can be formed by laminating a foil of a metal (e.g., copper) over the substrate 202. Lamination of a metal foil is typically performed when the substrate 202 comprises a polyimide or tape base material. The lamination of the metal foil to the substrate can be performed by the supplier of the substrate 202, so that a preformed substrate 202 with a conductive layer can be purchased from the supplier. Alternatively, where the substrate 202 is a rigid substrate or an organic substrate, such as a fiberglass base material substrate, the substrate 202 can be laminated with a single faced (two-layer) or double faced (three layer) metal foil. For instance, the conductive layer 200 and substrate 202 can comprise a copper clad laminate (CCL). CCL includes a two or three layer board, which consists of single faced (two-layer) or double faced (three layer) copper foil laminated on a substrate. Each copper foil is typically laminated at the substrate material maker. It will be appreciated that the conductive layer 200 can be provided on the substrate 202 using other methods.

Figure 4:
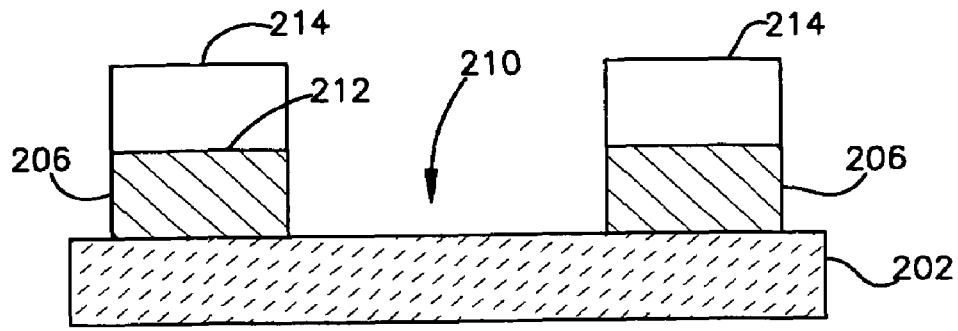
FIG. 4 illustrates a schematic cross-sectional view of the structure of FIG. 3 after the conductive layer has been etched to form an opening.

FIG. 4 illustrates the conductive layer 200 can be etched to form a substantially annular sidewall 206. The substantially annular sidewall 206 can define an opening 210 that extends from a top surface 212 of the substantially annular sidewall 206 to the substrate 202. The substantially annular sidewall 206 forms an outer portion of a contact pad.

The etching process used to form the substantially annular sidewall 206 can include forming (e.g., by conventional spin-coating or spin-casting deposition techniques) a patterned photoresist 214 over the conductive layer 200. The patterned photoresist can be used as a mask 214 that defines an area of the substantially annular sidewall 206 during the etching process. Any suitable etch technique can then be used to etch the conductive layer 200 (FIG. 3). For example, the conductive layer 200 can be anisotropically etched with etchant gas(es), (e.g., carbon tetrafluoride ($CF_4$) containing fluorine ions or trifluoromethane ($CHF_3$) and argon) in a commercially available etcher, such as a parallel plate reactive ion etching (RIE) apparatus or an electron cyclotron resonance (ECR) plasma reactor. In one aspect of the invention, a selective etch technique can be used to etch the conductive layer 200 at a relatively greater rate as compared to the rate of the patterned photoresist.

Figure 5:
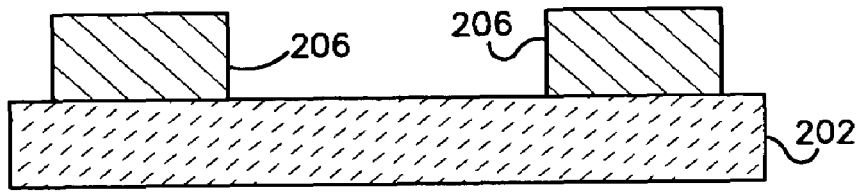
FIG. 5 illustrates a schematic cross-sectional view of the structure of FIG. 4 after a patterned photoresist overlying a portion of the conductive layer has been removed.

FIG. 5 illustrates the patterned photoresist 214 (FIG. 4) is stripped off the annular sidewall 206 (e.g., ashing in an $O_2/H_2O$ plasma) and cleaned by wet chemical cleanup processes following the etching process. Those skilled in the art would be familiar with a variety of different chemical cleanup procedures that can be employed to clean the structure.

Figure 6:
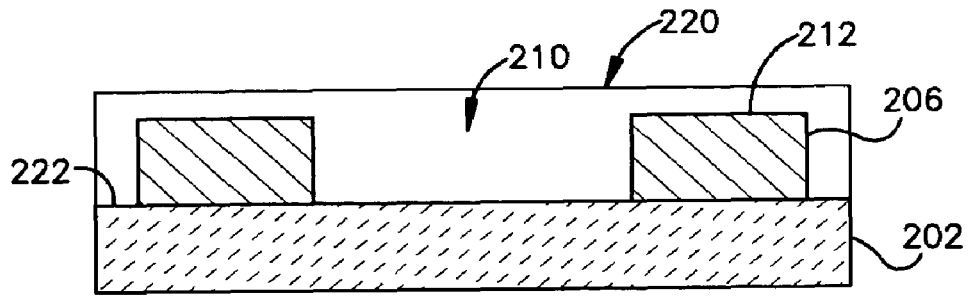
FIG. 6 illustrates a schematic cross-sectional view of the structure of FIG. 5 after a compliant layer has been formed over the etched conductive layer.

FIG. 6 illustrates a compliant layer 220 is formed in the opening 210 defined by the annular side wall 206. The compliant layer 220 can comprise a compliant material that readily flexes to relieve (or distribute) mechanical stress. In one aspect of the invention, the compliant layer 220 can be sufficiently flexible to distribute mechanical stress applied to the compliant layer 220. In another aspect of the invention, the compliant layer 220 can be more flexible than the conductive layer 200 and the substrate 202. The compliant material can comprise a flexible material that when formed into a layer is more flexible than a comparable layer of the material used to form the conductive layer 200. Examples of flexible materials can include flexible silicones, flexible epoxies, flexible polyimides, flexible fluoropolymers, and other flexible thermoplastic and thermosetting polymers.

The compliant material can also comprise a metal material, a non-metal material, a ceramic, or a composite of the foregoing. The compliant material can have an elastic modulus lower than the material used to form the conductive layer. For example, where the conductive layer comprises copper (modulus of elasticity about 17 $lbs/in^2 \times 10^6$) the compliant layer can be formed from lead (modulus of elasticity about 2 $lbs/in^2 \times 10^6$), aluminum (modulus of elasticity about 10 $lbs/in^2 \times 10^6$), tin (modulus of elasticity about 6 $lbs/in^2 \times 10^6$), zinc (modulus of elasticity about 12 $lbs/in^2 \times 10^6$), gold (modulus of elasticity about 12 $lbs/in^2 \times 10^6$), and silver (modulus of elasticity about 11 $lbs/in^2 \times 10^6$). It will be appreciated, though, that the compliant material can comprise a metal, non-metal, ceramic, or composite of the foregoing material than can have an elastic modulus higher the elastic modulus of the material used to form the conductive layer, as long as the compliant layer 220 readily flexes. For example, the conductive layer can comprise copper (modulus of elasticity about 17 $lbs/in^2 \times 10^6$) and the compliant layer can comprise platinum (modulus of elasticity about 21 $lbs/in^2 \times 10^6$). The platinum compliant layer 220, however, can include pores, voids, or apertures that allow the compliant layer to more readily flex than the conductive layer 200.

The compliant layer 220 can be formed using any suitable conventional deposition technique, such as CVD, sputtering, electroless and electrolytic plating, evaporation techniques, PVD, low-pressure CVD (LPCVD), plasma-enhanced CVD (PECVD), MOCVD, PLD, or film growth techniques. To ensure complete filling of the opening 210, the compliant layer 220 can be deposited as a blanket (or overburden) layer, so as to fill the opening 210 and cover the top surface 212 of the annular sidewall 206 and an exposed surface 222 of the substrate 202.

Figure 7:
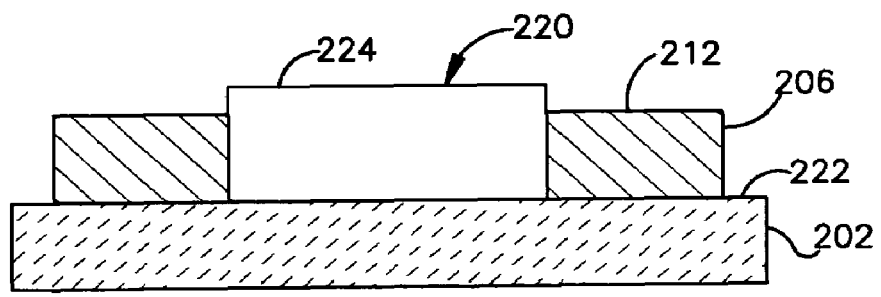
FIG. 7 illustrates a schematic cross-sectional view of the structure of FIG. 6 after a portion of the compliant layer has been removed.

FIG. 7 illustrates the compliant material overlying the top surface 212 of the annular sidewall 206 and the exposed surface 222 of the substrate 202 is removed following formation of the compliant layer 220. The compliant layer 220 as illustrated in FIG. 7 can have a thickness that is greater than thickness of the annular sidewall 206. Optionally, the compliant layer 220 can have the same thickness as the annular sidewall 206 so that a top surface 224 of the compliant layer 220 is substantially co-planar with the top surface 212 of the annular sidewall 206.

The compliant material can be removed from the top surface 222 of the annular sidewall 206 and the exposed surface 222 of the substrate 202 using conventional techniques. For example, the compliant material can be removed using an etching process. The etching process can include forming (e.g., by conventional spin-coating or spin-casting deposition techniques) a patterned photoresist (not shown) over the top surface 224 of the compliant layer 220. The patterned photoresist can form a mask that is aligned over the opening. Any suitable etch technique can then be used to etch the compliant layer 220. For example, the compliant layer can be anisotropically etched with etchant gas(es), (e.g., carbon tetrafluoride ($CF_4$) containing fluorine ions or trifluoromethane ($CHF_3$) and argon) in a commercially available etcher, such as a parallel plate reactive ion etching (RIE) apparatus or an electron cyclotron resonance (ECR) plasma reactor. In one aspect of the invention, a selective etch technique can be used to etch the compliant layer 220 at a relatively greater rate as compared to the rate of the patterned photoresist. Following etching, the photoresist layer can be stripped off the conductive layer (e.g., ashing in an $O_2/H_2O$ plasma) and cleaned by wet chemical cleanup processes following the etching process. Those skilled in the art would be familiar with a variety of different chemical cleanup procedures that can be employed to clean the structure. It will also be appreciated that other techniques can be used for removing the compliant material.

Figure 8:
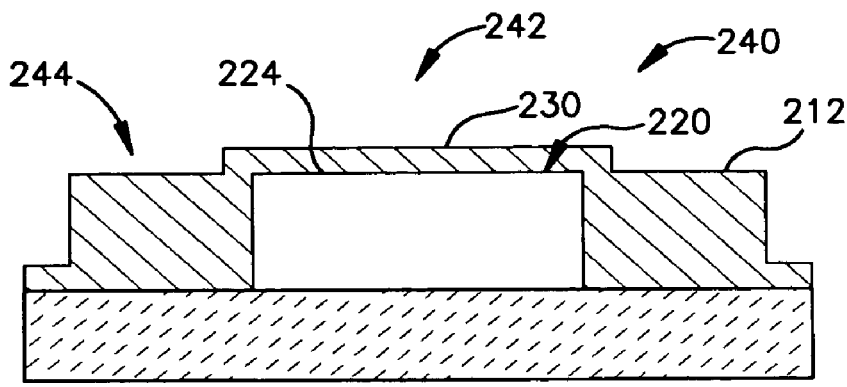
FIG. 8 illustrates a schematic cross-sectional view of the structure of FIG. 7 after a second conductive layer is formed over the first conductive layer and the compliant layer.

FIG. 8 illustrates a second conductive layer 230 is formed over the surface 224 of the compliant layer 220 and the top surface 212 of the annular sidewall 206 to form a contact pad 240 with an inner portion 242 and an outer portion 244. The second conductive layer 230 has a thickness that is substantially less than the thickness of the conductive layer 200 that forms the annular sidewall 206. The reduced thickness of the second conductive layer 230 compared to the conductive layer 206 allows the second conductive layer 230 to be substantially less rigid (i.e., substantially more flexible) than the conductive layer 200.

The second conductive layer 230 can include any conductive metal that can be used to form a contact pad for a semiconductor device and that can be used for solder attachment. In one example, the second conductive layer 230 can comprise copper. Other examples of conductive metals that can be used to form the second conductive layer 230 include copper alloy, aluminum, aluminum alloy, tungsten, tungsten alloy, gold, silver, nickel, tin, platinum, iridium, or combinations of the foregoing. Other metals or non-metals that are suitable for forming a contact pad can also be used. In another example, the second conductive layer 230 can comprise conductive metal that is the same as the conductive metal used to form the same conductive metal. For example, the conductive layer 200 and the second conductive layer 230 can both be formed from copper.

The second conductive layer 230 can be formed using any suitable conventional metal deposition technique, such as CVD, sputtering, electroless and electrolytic plating, and evaporation techniques. It will be appreciated, however, other techniques can be used to form the second conductive layer 230, such as other deposition techniques, for example, PVD, MOCVD, PLD, or film growth techniques.

Figure 9:
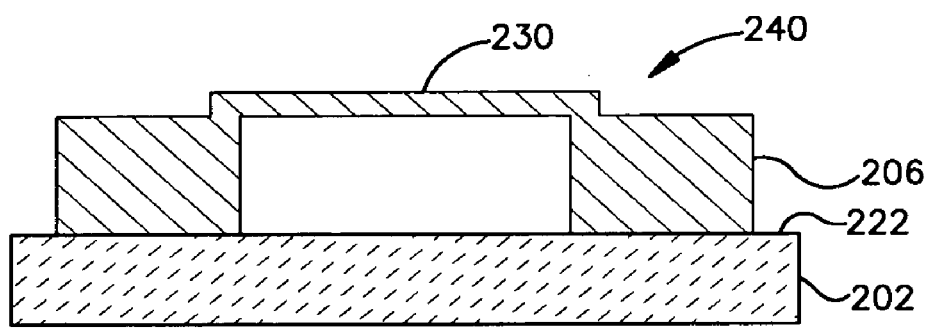
FIG. 9 illustrates a schematic cross-sectional view of the structure of FIG. 8 after a portion of the second conductive layer has been removed.

FIG. 9 illustrates the second conductive layer 230 overlying the exposed surface 222 of the substrate 202 is removed to at least partially isolate the contact pad 240. The second conductive layer 230 can be removed, for example, using an etching process. The etching process can include forming (e.g., by conventional spin-coating or spin-casting deposition techniques) a patterned photoresist over the contact pad 240, etching the second conductive layer 230 with an etchant gas (e.g., carbon tetrafluoride ($CF_4$) containing fluorine ions or trifluoromethane ($CHF_3$) and argon), and stripping (e.g., ashing in an $O_2/H_2O$ plasma) the patterned photoresist from the contact pad 204. Those skilled in the art would be familiar with a variety of different etching processes that can be used to etch the second conductive layer 230.

Figure 10:
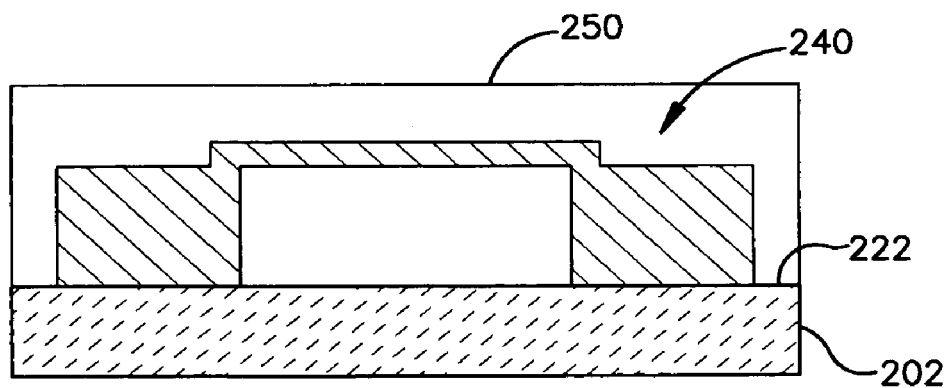
FIG. 10 illustrates a schematic cross-sectional view of the structure of FIG. 9 after an insulative layer is formed over the second conductive layer.

FIG. 10 illustrates an insulative layer 250 is formed over the contact pad 240 and the exposed surface 222 of the substrate 202. The insulative layer 250 can be blanket deposited so that the contact pad 240 and the exposed surface 222 of the substrate 202 are substantially covered. The insulative layer 250 can comprise a polymer material, such as an acrylic or polyimide plastic or epoxy resin. In one example, the insulative layer 250 can comprise a photoimageable dielectric material, such as a negative or positive tone resist. An example of a photoimageable resist is commercially available from Taiyo America, Inc., Carson City, Nev. under the trade name PSR-4000. The PSR-4000 resist can be mixed with an epoxy, such as epoxy 720 manufactured by Ciba-Geigy (e.g., 80% PSR-4000 and 20% epoxy 720). Another example of a photoimageable resist is commercially available from Shipley under the trade name XP-9500.

The insulative layer 250 can be blanket deposited onto the contact pad 140 and the substrate 202 using a suitable deposition process, such as deposition technique, such as CVD, spin-on, spray, PVD, PECVD, HDCVD, MOCVD, PLD, or film growth techniques. It will be appreciated that other techniques can be used for forming the insulative layer 250. Following blanket deposition of the insulative layer 250, the insulative layer 250 can be prebaked to at least partially harden the insulative layer 250. For example, the insulative layer 250 can be prebaked at about 95° C. for about 15 minutes.

Figure 11:
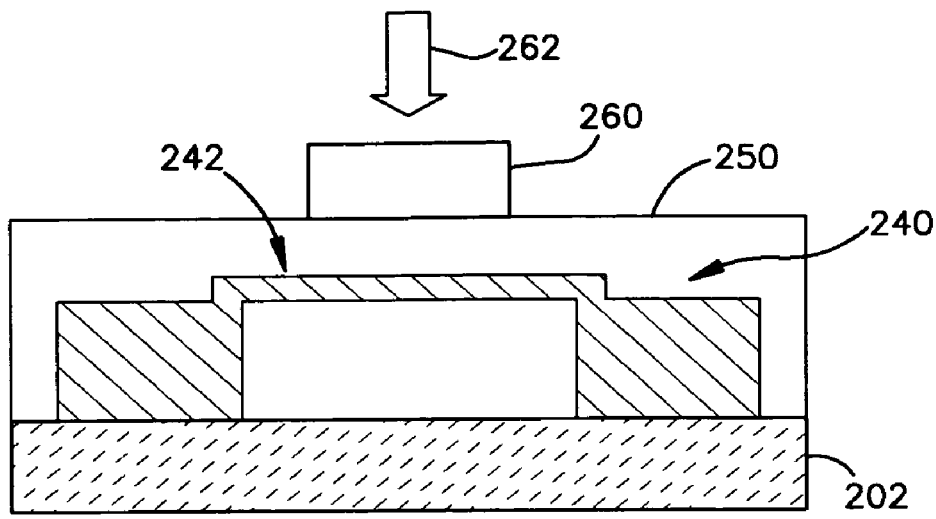
FIG. 11 illustrates a schematic cross-sectional view of the structure of FIG. 10 of the insulative layer undergoing a patterning process.

FIG. 11 illustrates the insulative 250 layer is exposed to ultra-violet light (UV) using a mask 160 and a conventional UV aligner 262 to form a desired pattern in the insulative layer. The mask 260 is aligned over the insulative layer 250, and a central area of the inner portion of the contact pad. A representative UV dose can be about 165 $mJ/cm^2$.

Following exposure of the insulative layer 250 to UV, the insulative layer 250 can be developed. The developing can be performed using a suitable developing solution, such as about 1 to about 1.5 percent solution of sodium monohydrate ($Na_2CO_3$—$H_2O$), or potassium carbonate monohydrate ($K_2CO_3$—$H_2O$). Following development, the insulative layer 250 can then be rinsed, dried, and cured. Curing can be performed by exposure of the insulative layer 250 to UV at a desired power (e.g., about 3 to about 5 $J/cm^2$), or by heating insulative layer 250 to a desired temperature (e.g., about 150° C. to about 155° C.) for a desired time (e.g., about one hour).

Figure 12:
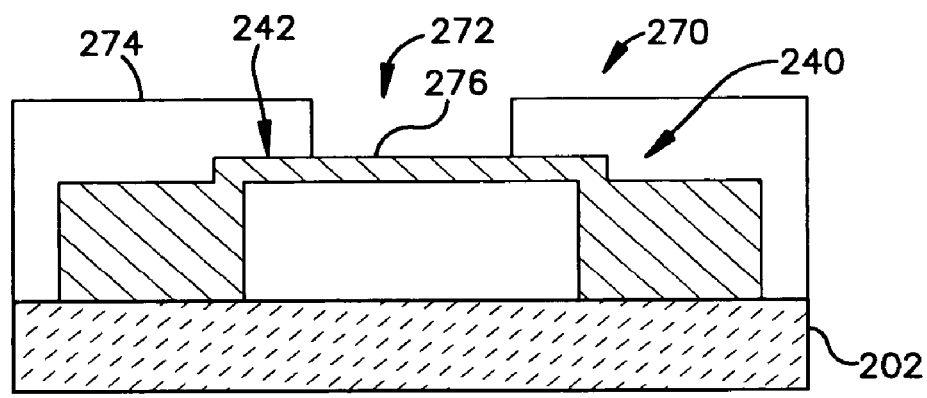
FIG. 12 illustrates a schematic cross-sectional view of the structure of FIG. 111 after the patterned insulative layer has been developed.

As shown in FIG. 12, exposing and developing the insulative layer forms an insulatative mask 270 over the contact pad 240 and the substrate 202. The insulative mask 270 includes an opening 272 for receiving a solder contact (not shown). The opening 272 is aligned over a central area of the inner portion 242 of the contact pad 240. The opening can be substantially cylindrical and extend from a surface 274 of the insulative mask 270 to a contact surface 276 of the inner portion 242. The diameter of the opening is such that only a central area of the inner portion 242 of the contact pad 240 is exposed.

After formation of the insulative mask 270, a solder contact (not shown) can be attached to the contact surface 276 of the inner portion 242 so that an interconnect structure is formed that has a structure substantially similar to the interconnect structure of FIG. 2. The solder contact can be attached to contact surface 276 of the contact pad using a suitable deposition technique (e.g., evaporation, plating, or pre-fabricated units) and reflow technique (e.g., infrared or radiant technique). The material used to form the solder contact can include alloys of led, tin, indium, silver, or combinations of the foregoing. It will be appreciated that other material can also be used in forming the solder contact, such as solder paste, flux, and conductive adhesive compounds.

Figure 13:
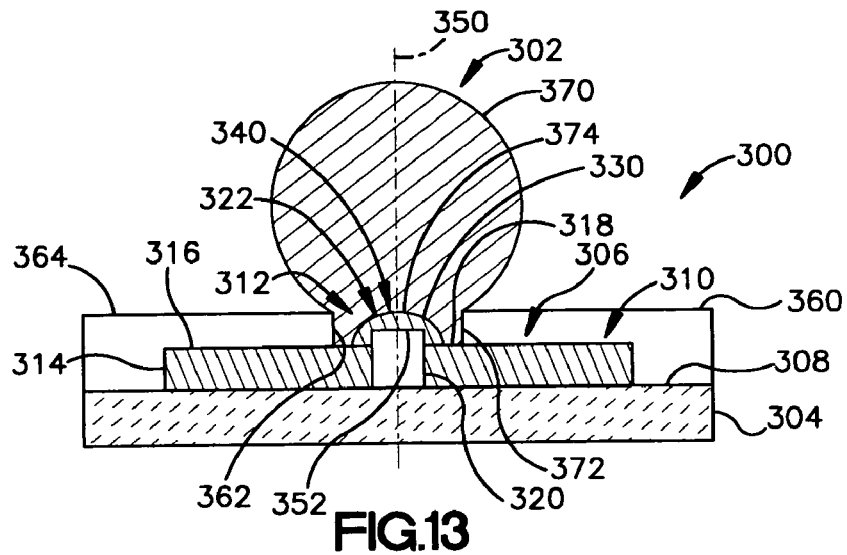
FIG. 13 illustrates a schematic cross-sectional view of a portion of an interconnect structure and a solder contact in accordance with another aspect of the present invention.

FIG. 13 illustrates a schematic cross-sectional view of another exemplary interconnect structure 300 and a solder contact 302 (e.g., solder ball) attached to the interconnect structure 300. The interconnect structure 300 includes a substrate 304 and a contact pad 306 disposed over a surface 308 of the substrate 304. The substrate 304 can comprise a substantially planar sheet of insulative material, such as fiberglass (e.g., flame retardant fiberglass composite substrate board), polyimide tape (e.g., BT-resin), or ceramic. Alternatively, the substrate 304 can comprise a layer on a semiconductor die, such as silicon oxide (SiO), silicon nitride ($Si_3N_4$), polyimide, silicon dioxide ($SiO_2$), or some other insulative material formed on a die. It will be appreciated that other materials can be used to form the substrate 304.

The contact pad 306 includes an outer portion 310 and an inner portion 312 that is substantially more flexible than the outer portion 310. The outer portion 310 comprises at least one conductive layer 314 that surrounds the inner portion 312 of the contact pad 306. The at least one conductive layer 314 has a substantially planar top surface 316 that forms the top surface 316 of the outer portion 310. At least part of the top surface 316 of the outer portion 310 can define a portion of a contact surface 318 of the contact pad 306. The thickness of the at least one conductive layer 314 that forms the outer portion 310 is such that the outer portion 310 can be substantially rigid. The at least one conductive layer 314 can comprise at least one metal (e.g., copper, aluminum, gold, silver, nickel, tin, platinum, or a combination of the foregoing) that has been formed (e.g., by lamination or plating) on the surface 308 of the substrate 304 and then patterned (e.g., photolithography).

The inner portion 312 of the contact pad 306 has sufficient flexibility to distribute mechanical stress applied to the contact pad 306 and mitigate damage to the interconnect structure 300. The inner portion 312 of the contact pad 306 includes a compliant layer 320 and an inner conductive layer 322 that is disposed over the compliant layer 320. The inner conductive layer 322 has a surface 330 that defines a top surface 330 of the inner portion 312 and a portion of the contact surface 318 of the contact pad 306. The top surface 330 of the inner portion 312 protrudes above the top surface 316 of the outer portion 310 and forms a protrusion 340 in the contact surface 318 of the contact pad 306. The protrusion 340 has a substantially arcuate shape that extends about an axis 350 (i.e., half-dome shape). It will be appreciated that the protrusion 340 can have other shapes, such as frustoconical, semispherical, or truncated cone.

The protrusion 340 in the contact surface 318 can increase the area of the contact surface 318 that is capable of being wetted by the solder contact 302. The increased wetting area can further distribute mechanical stresses at the interface between the contact pad 306 and the solder contact 302. This distribution of mechanical stress can substantially improve shear performance and attach yield of the solder contact 302 to the contact pad 306.

The inner conductive layer 322 that defines the surface 330 of the protrusion 340 has a thickness substantially less than the thickness of the conductive layer 314 of the outer portion 310 of the contact pad 306. The reduced thickness of inner conductive layer 322 compared to the conductive layer 314 allows the inner conductive layer 322 to be substantially less rigid (i.e., substantially more flexible) than the conductive layer 314 of the outer portion 310. The inner conductive layer 322 can comprise the same metal (e.g., copper, aluminum, gold, silver, nickel, tin, platinum, or a combination of the foregoing metals) as the conductive layer 322 and be formed on a surface 352 of the compliant layer 320 (and conductive layer 314) by for example, lamination or plating.

The compliant layer 320 comprises compliant material that readily flexes to relieve (or distribute) mechanical stress applied the contact pad 306. In one aspect of the invention, the compliant layer 320 can be sufficiently flexible to distribute mechanical stress applied to the contact pad 306 and mitigate damage to the interconnect structure 300. In another aspect of the invention, the compliant layer 320 can be more flexible than inner conductive layer 322. The compliant material can be a metal, non-metal material, ceramic, or composite thereof hat can be deposited (e.g., plating, CVD, or spin-on) on the surface of the substrate 304. The compliant material can have an elastic modulus lower than the material used to form the conductive layer and the inner conductive layer 322. It will be appreciated, though, that the compliant material can have an elastic modulus higher the elastic modulus of the material used to form the conductive layer and the inner conductive layer 322, as long as the compliant layer 320 readily flexes.

The contact pad 306, in addition to including the inner portion 312 and the outer portion 310, can include one or more circuit traces (not shown) radiating outward from the central pad. Alternatively, or in addition to the circuit traces, a via (not shown) can electrically connect the contact pad 306 with an opposite surface of the substrate 304.

An insulative mask 360 is disposed over the surface 308 of the substrate 304 and the contact pad 306. The insulative mask 360 can electrically isolate the contact pad 306 from the conductive traces (not shown). The insulative mask 360 can define an opening 362 that is aligned over part of the outer portion 310 and the inner portion 312 of the contact pad 306. The opening 362 can be substantially cylindrical and extend from a surface 364 of the insulative mask 360 to the contact surface 318 of the outer portion 310 and the inner portion 312. The diameter of the opening 362 is such that the protruding top surface 330 of the inner portion 312 and a part of the top surface 316 of the outer portion 310 is exposed. The insulative mask 360 can comprise, for example, an acrylic or polyimide plastic or epoxy resin, that can be deposited on the contact pad 306, patterned (e.g., photolithography), and developed.

The solder contact 302 includes a ball portion 370 and a contact portion 372. The ball portion 370 is seated over the opening 362 of the insulative mask 360. Although the ball portion 370 of the solder contact 302 is illustrated as being substantially spherical, the ball may have various forms, such as semispherical, half-dome, or truncated cone.

The exact shape of the ball portion 370 is a function of the deposition technique (e.g., evaporation, plating, or prefabricated units) and reflow technique (e.g., infrared or radiant technique), and the material composition. The contact portion 372 of the solder contact 302 extends from the ball portion 370 to form a solder joint 374 with the contact surface 318. The insulative mask 360 defines the outer surface of the contact portion 372 and prevents the contact portion 372 from contacting the conductive traces (not shown). The material used to form the solder contact 302 can include alloys of led, tin, indium, silver, or combinations of the foregoing metal. It will be appreciated that other materials can also be used in forming the solder contact 302, such as solder paste, flux, and conductive adhesive compounds.

Figure 14:
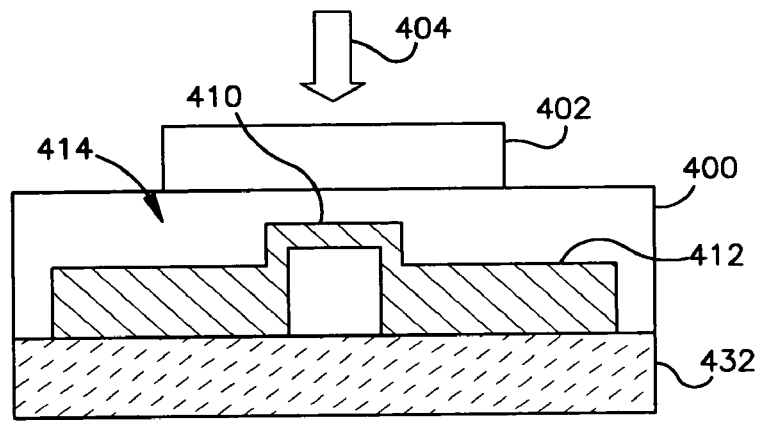
FIG. 14 illustrates a schematic cross-sectional view of an insulative layer of an interconnect structure undergoing a patterning process in accordance with another aspect of the invention.
Figure 15:
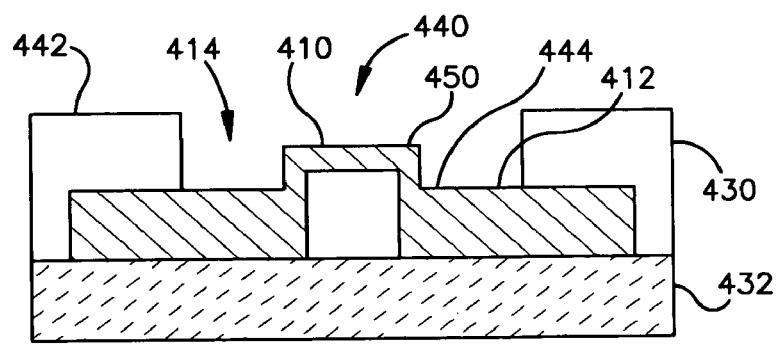
FIG. 15 illustrates a schematic cross-sectional view of the structure of FIG. 14 after the patterned insulative layer has been developed.

The interconnect structure 300 in accordance with this exemplary embodiment can be formed using a similar methodology as the methodology described and illustrated with respect to FIGS. 3-12. The methodology can differ slightly from the methodology illustrated in FIGS. 11 and 12 used to form the insulative mask. FIGS. 14 and 15 illustrate this change in methodology. Referring to FIG. 14, an insulative layer 400 is exposed to UV using a mask 402 and a conventional UV aligner 404 to form a desired pattern in the insulative layer 400. The mask 402 is aligned over an insulative layer 400 and an inner portion 410 and part of the outer portion 412 of a contact pad 414, as opposed to only the central area of the inner portion 142 as illustrated in FIG. 11.

Following exposure of the insulative layer 400 to UV, the insulative layer 400 can be developed. The developing can be performed using a suitable developing solution such as about 1 to about 1.5 percent solution of sodium monohydrate ($Na_2CO_3$—$H_2O$), or potassium carbonate monohydrate ($K_2CO_3$—$H_2O$). Following development, the insulative layer 400 can then be rinsed, dried, and cured. Curing can be performed by exposure of the insulative layer 400 to UV at a desired power (e.g., about 3 to about 5 $J/cm^2$), or by heating insulative layer to a desired temperature (e.g., about 150° C. to about 155° C.) for a desired time (e.g., about one hour).

As shown in FIG. 15, exposing and developing the insulative layer 400 forms an insulative mask 430 over the contact pad 414 and a substrate 432. The insulative mask 330 has an opening 440 for receiving a solder contact (not shown). The opening 440 is aligned over a protruding inner portion 410 and a part of the outer portion 412 of the contact pad 414. The opening 440 can be substantially cylindrical and extend from a surface 442 of the insulative mask 430 to a contact surface 444 of the contact pad 414. The diameter of the opening 414 is such that the entire protruding inner portion 410 and a part of the outer portion 412 are exposed as opposed to just the central area of the inner portion 142 shown in FIG. 12. This allows inner portion to define a protrusion 450 that extends from the contact surface to which the solder contact (not shown) can adhere.

Those skilled in the art will also understand and appreciate that variations in the processing operations can be utilized in the formation of the interconnect structure (100 or 300). For example, it will be appreciated that the insulative mask can be formed from a material that is not photoimageable and etched using an etching process instead of being developed. Additionally, it will be appreciated that a plurality of interconnect structures can be formed on the substrate and these plurality of interconnect structures and receive a plurality of solder contacts. Moreover, it will be appreciated that if the compliant layer comprises a polymer, a photoimageable polymer can used to form the compliant layer. Further, it will be appreciated that the interconnect structure can be used in flip chip packages as well as ball grid array packages.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An interconnect structure comprising:
   a substrate;
   a conductive contact pad having a first elastic modulus, disposed over a portion of the substrate surface, having an inner portion and an outer portion surrounding the inner portion;
   a compliant layer having a second elastic modulus lower than the first elastic modulus, disposed directly under the inner portion of the contact pad but not under the outer portion of the contact pad;
   wherein said compliant layer having a thickness greater than the thickness of said outer portion
   the portion of the contact pad over the compliant layer having a thickness thinner than the thickness of the outer portion of the contact pad; and
   an insulative mask disposed over the contact pad including an opening that exposes the inner portion of the contact pad.

2. The interconnect structure of claim 1, in which the contact pad comprises a conductive metal and the compliant layer comprises a metal.

3. The interconnect structure of claim 1, in which the contact pad comprises copper and the compliant layer comprises a material having an elastic modulus lower than the elastic modulus of copper.

4. The interconnect structure of claim 3, in which the compliant layer has pores, apertures, and voids.

5. The interconnect structure of claim 1, in which the inner portion of the contact pad is more flexible than the outer portion.

6. The interconnect structure of claim 1, in which the opening uncovers a substantially planar contact surface.

7. The interconnect structure of claim 1, further including a solder contact attached to the contact surface, the solder contact including a contact portion defined by the opening of the insulative mask.

8. The interconnect structure of claim 7, in which the thickness of the compliant layer is greater than the thickness of the outer portion of the contact pad.

9. The interconnect structure of claim 1, in which the contact pad comprises a conductive metal and the compliant layer comprises a polymer.

10. The interconnect structure of claim 1, in which the contact pad comprises a conductive metal and the compliant layer comprises a dielectric material.

11. A semiconductor device comprising:
    a substrate;
    a conductive contact pad having a first elastic modulus, disposed over the substrate surface, having an inner portion and an outer portion of the same conductive material,
    the inner portion having a first thickness, the outer portion parallel to the substrate surface, having a second thickness greater than the first thickness and enclosing the inner portion;
    a compliant layer having a second elastic modulus lower than the first elastic modulus, disposed directly under the contact pad, covered by the inner portion of the contact pad and contacting the outer portion of the contact pad; wherein said compliant layer having a thickness greater than the thickness of said outer portion; and
    an insulative mask disposed over the contact pad including an opening that exposes a portion of the outer portion and the inner portion of the contact pad.

12. The semiconductor device of claim 11, in which the inner portion and the outer portion of the contact pad are co-planar.

13. The semiconductor device of claim 11, in which the outer portion has a first bottom surface, the compliant layer has a second bottom surface, and the first and the second bottom surfaces are co-planar.

14. The semiconductor device of claim 11, in which the compliant layer has a thickness greater than the second thickness.

* * * * *